United States Patent [19]

Benjamin et al.

[11] Patent Number: 4,574,207
[45] Date of Patent: Mar. 4, 1986

[54] LATERAL BIDIRECTIONAL DUAL NOTCH FET WITH NON-PLANAR MAIN ELECTRODES

[75] Inventors: James A. Benjamin, Waukesha; Herman P. Schutten, Milwaukee, both of Wis.; Robert W. Lade, Fort Myers, Fla.

[73] Assignee: Eaton Corporation, Cleveland, Ohio

[21] Appl. No.: 390,471

[22] Filed: Jun. 21, 1982

[51] Int. Cl.⁴ .......................................... H03K 17/687
[52] U.S. Cl. ................................... 307/577; 307/584; 357/23.4; 357/23.8; 357/23.14; 357/39; 357/43; 357/86; 357/55; 357/59
[58] Field of Search ...... 357/23 VD, 23 MG, 23 HV, 357/43, 55, 59, 86, 23.4, 18, 14, 41; 307/577, 584

[56] References Cited

U.S. PATENT DOCUMENTS 3,798,514 3/1974 Hayashi et al. ............... 357/23 VD
4,199,774 4/1980 Plummer ...................... 357/23 VD

OTHER PUBLICATIONS

Y. Hayashi et al., "Exp. Fab. of Non-Planar DSA-MOS Trans. & Their Char.," Bull. Electro. Tech. Lab. (Japan), vol. 40, #4–5, 1976, pp. 328–337.
P. Ou-Yang, "Double Ion Implanted V-MOS Tech.," IEEE J. of S.-S. Ckts., vol. SC-12, #1, Feb. 1977, pp. 3–10.
J. Tihanyi, "Funct Integ. of Power MOS and Bipolar Devices," Proc. 1980, IEEE IEDM, Dec. 1980, pp. 75–78.
"A Parametric Study of Power MOSFET'", C. Hu, IEEE Electron Device Conference; Paper CH 1461-3/79, 0000-0385.
IEEE Transactions Electron Devices, vol. ED-25; #10; Oct., 1978.
"UMOS Transistors on (110) Silicon", Ammar & Rogers, Transactions IEEE; ED-27; May, 1980; pp. 907–914.
"Optimum Doping Profile for Minimum Ohmic Resistance and High Breakdown Voltage", C. Hu; IEEE Transactions Electron Devices; vol. ED-26; 1970; pp. 243–244.

Primary Examiner—Joseph E. Clawson, Jr.
Attorney, Agent, or Firm—Andrus, Sceales, Starke & Sawall

[57] ABSTRACT

Lateral FET structure is disclosed for bidirectional power switching, including AC appliction. Main electrodes extend downwardly into and through respective source regions and at least into regions having respective channel portions. Notch gate structure extends into the drift region and separates the main electrodes and the respective source regions and channels. High density, high voltage plural FET structure is disclosed.

20 Claims, 20 Drawing Figures

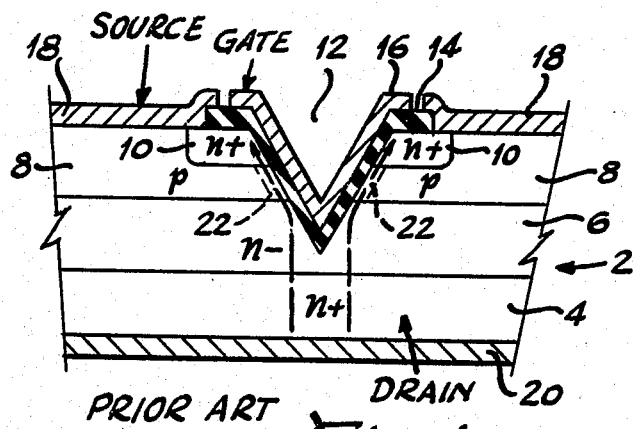
Fig. 1 VMOS FET (PRIOR ART)
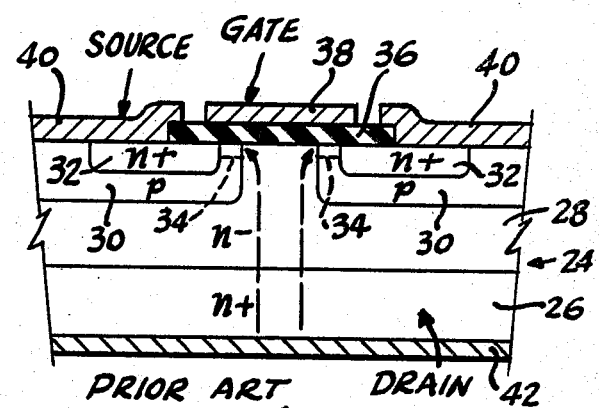
Fig. 2 DMOS FET (PRIOR ART)
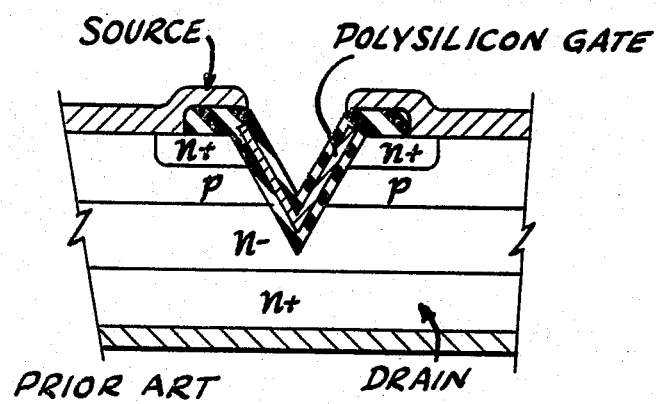
Fig. 3 VMOS WITH POLY-SI GATE (PRIOR ART)

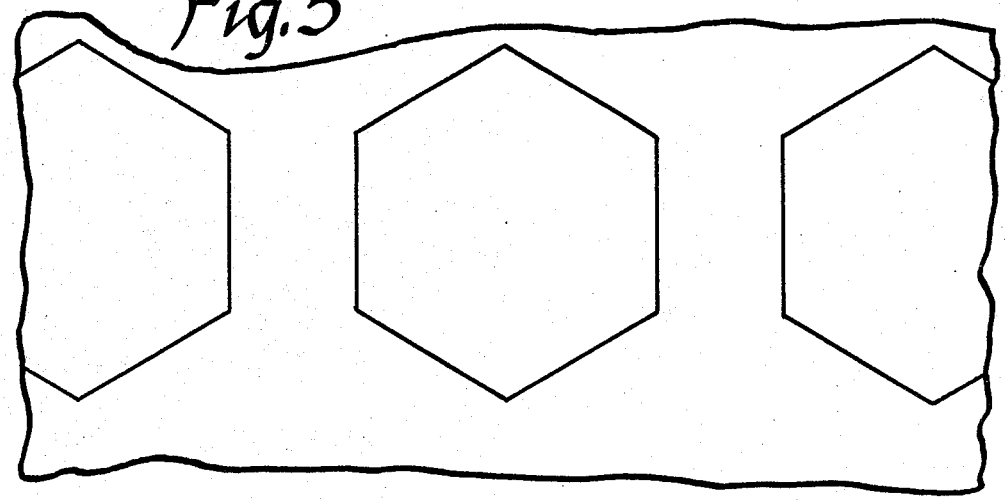
Fig. 5
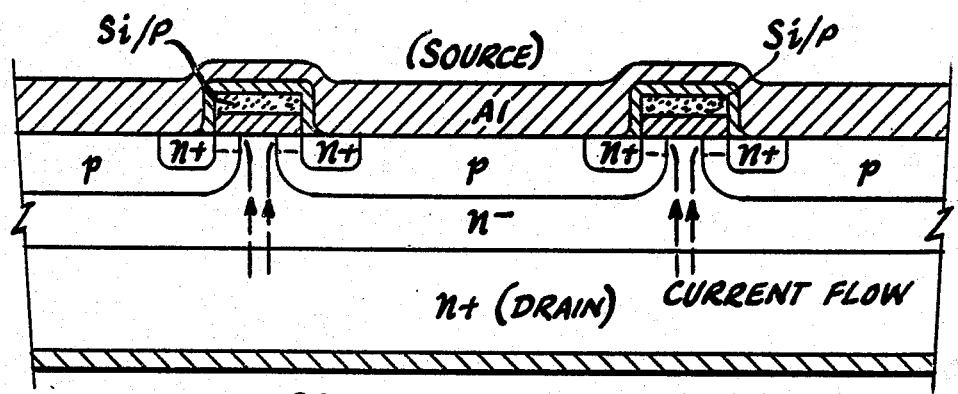
Fig. 4 PRIOR ART DMOS WITH POLY-SI GATE (HEX FET)
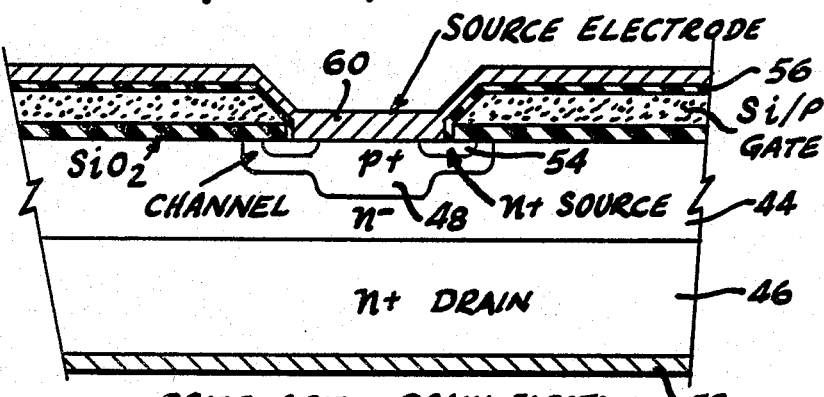
Fig. 6 PRIOR ART SIPMOS FET

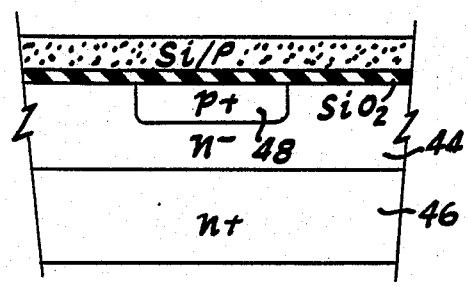
Fig. 7  PRIOR ART
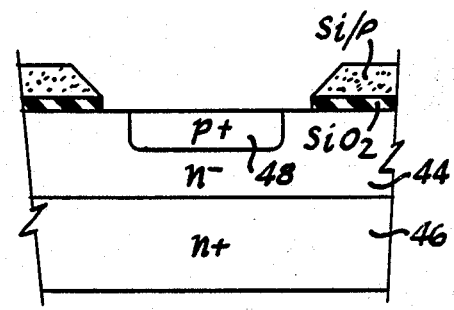
Fig. 8  PRIOR ART
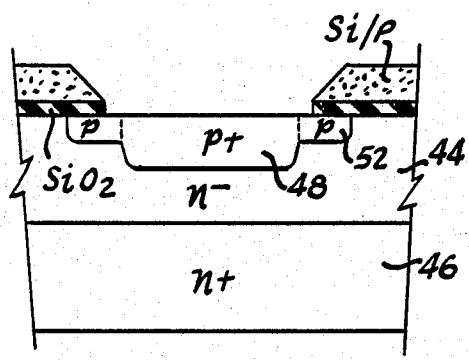
Fig. 9  PRIOR ART
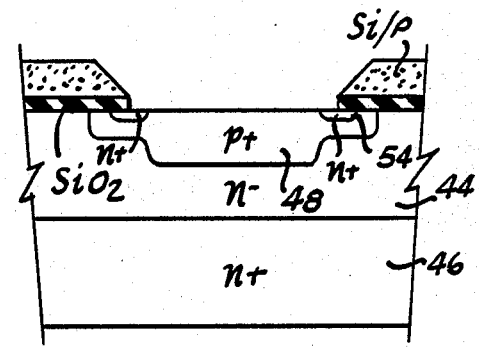
Fig. 10  PRIOR ART
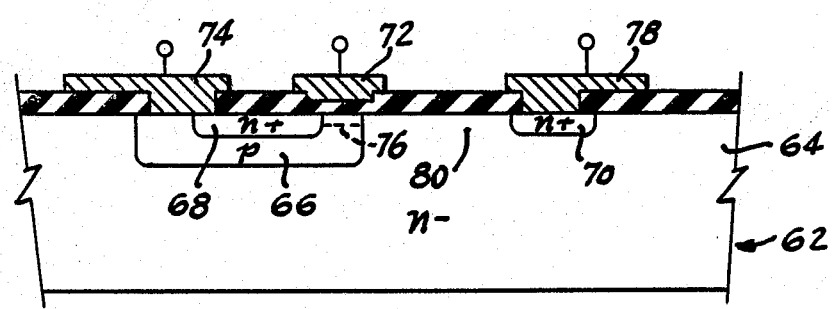
Fig. 11  PRIOR ART LATERAL MOSFET

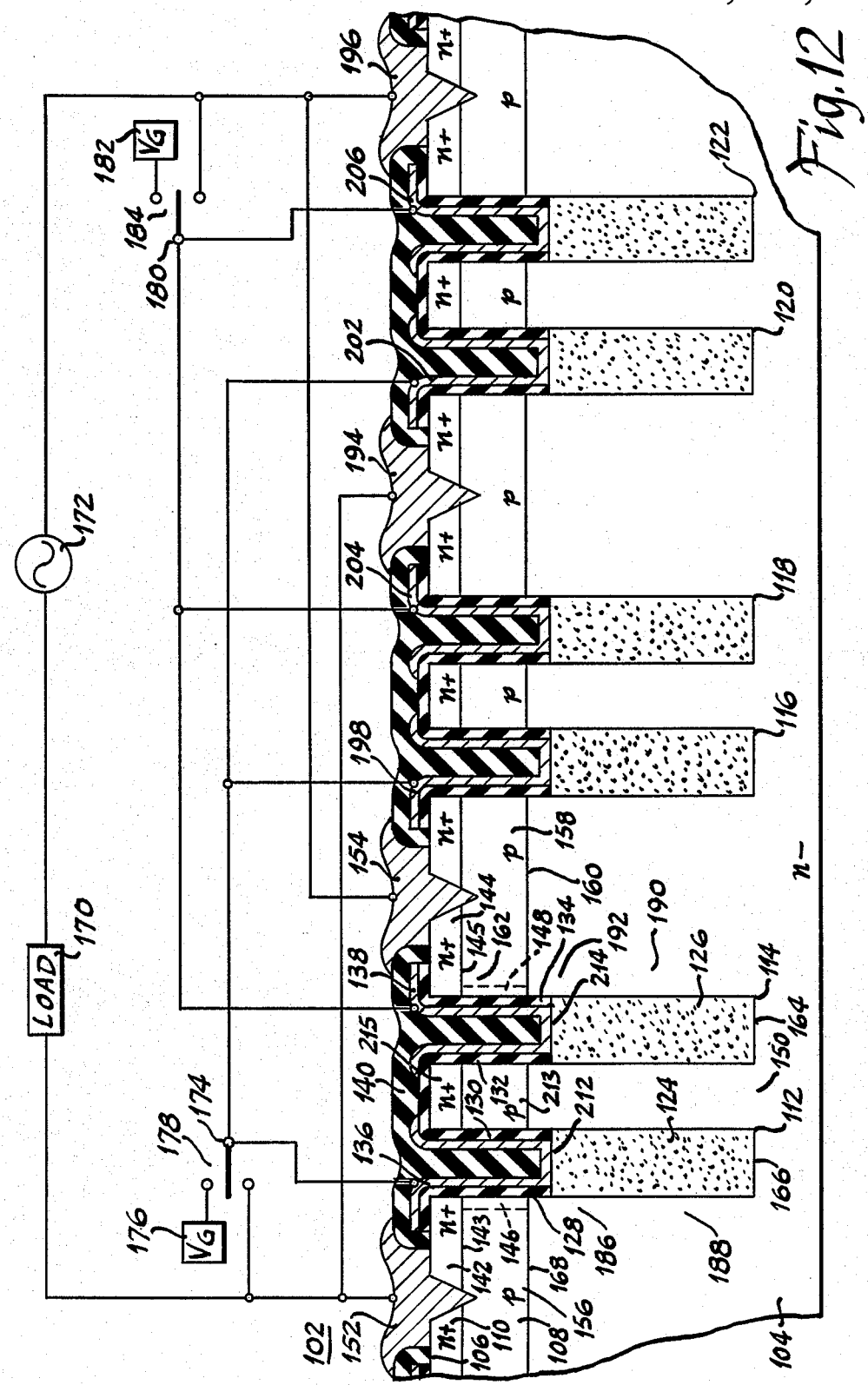

LATERAL BIDIRECTIONAL DUAL NOTCH FET WITH NON-PLANAR MAIN ELECTRODES

TECHNICAL FIELD

The invention relates to power switching semiconductors, and more particularly to power MOSFETs (metal oxide semiconductor field effect transistors), and the like.

BACKGROUND

The present invention evolved from efforts to develop a solid state device for high power switching applications to replace the low current circuit breaker or contactor, though the invention is of course not limited thereto. Performance requirements for such a device are demanding, and even modest specifications might include a 400 volt blocking capability with a corresponding ON state resistance of 0.05 ohms and an AC current rating 20 amps rms. Further, the system should be capable of interrupting a fault current of 5,000 amps without destroying itself. Additionally, manufacturing cost should be less than or equal to the circuit breaker or contactor cost.

High power switching in solid state devices has evolved over the last 30 years from the early milliwatt device to the present kilowatt "hockey puck" thyristor devices. Device processing has evolved from the early restrictive alloy/rate grown devices to planar and MOS VLSI structures, bringing the blocking voltages of switches from the 10 volt level of the 1950's to the kilovolt range today. Even with these great strides, however, the problem of developing a semiconductor device to replace the low current circuit breaker or contactor has remained unsolved.

There are three likely candidates for high power switching applications. Two of these are bipolar, i.e. they depend on the flow of two types of carriers, majority and minority. The third is unipolar, i.e. it depends only on majority carrier current flow.

The first two candidates are the thyristor and the bipolar transistor. Although the thyristor is capable of blocking a high reverse voltage, it can be characterized in the forward ON state by a fixed voltage source (one junction drop) and a resistance with a negative temperature coefficient, i.e. resistance decreases with increasing temperature. The bipolar transistor can be characterized in the forward ON state simply as a resistance with a negative temperature coefficient. In each case, it is extremely difficult to accommodate large current ratings through the paralleling of bipolar devices due to the effect of "current hogging". If a number of these devices are paralleled, and if one unit draws slightly more current than the others, it will heat up and its resistance will be reduced. This results in a still larger share of the current, further heating, etc. The result is usually the thermal destruction of that device and the subsequent overloading of the others. In general, current hogging prevents paralleling of these devices unless ballast resistance, a form of stabilizing negative feedback, is introduced. This resistance further adds to the total ON state resistance and is therefore highly undesirable. Other disadvantages are false dv/dt triggering of thyristors, and secondary breakdown problems in bipolar transistors.

The third candidate, the field effect transistor (FET), is exclusively a majority carrier device. Its resistance is related to temperature through the electron mobility. Its resistance has a positive temperature coefficient, namely the resistance is proportional to $T^{3/2}$. Since the electron mobility is 2.5 times greater than the hole mobility in silicon, the n channel device leads to lower ON state resistance. Further, since MOS devices give conductivity enhancement in the ON state, these devices are generally more conductive than their junction depletion-mode counterparts (JFET). Additionally, since minimal channel length (for low ON state resistance) and high packing densities are desirable, the vertical power MOSFET presently is leading all others in the power switching field.

Current commercially available MOSFETs have performance specifications approximately one order of magnitude below the minimal requirements noted above. Two current designs are the SIPMOS device and the HEXFET device, discussed more fully hereinafter.

In lateral power FETs, there is an inherent trade-off between voltage blocking capability and the lateral dimension or length of the drift region. Minimum ON state resistance demands minimum drift region length. But maximum blocking voltage commands maximum drift region length. This relationship is characterized by the equation $R_{on} = kV_B^{2.6}$ ohm-cm$^2$ where $R_{on}$ is the ON state resistance, k is a constant ($3.7 \times 10^{-9}$), and $V_B$ is the blocking voltage. This relationship has been studied in the literature, C. Hu, "Optimum Doping Profile For Minimum Ohmic Resistance and High Breakdown Voltage", IEEE Transactions Electron Devices, Volume ED-26, pages 243-244, 1979.

SUMMARY

The present invention provides lateral power FET structure which is bidirectional, i.e. current can flow in either direction when the device is in the ON state, whereby to afford AC application.

Main electrode and substrate structure provides easy processing and connection. This main electrode structure is provided in combination with a dual notch gate and substrate structure affording increased OFF state voltage blocking capability, including non-floating gate implementations.

First and second spaced notches extend downwardly from a top major surface to separate right and left source regions and right and left channel regions, and direct the drift region current path between the channels around the bottoms of the notches. Each main electrode extends into and through its respective source region and extends at least into its respective channel region.

The structure is particularly easy to fabricate with simple processing steps and masks. In a desirable aspect, the structure is suited to manufacture in a repetitive multi-cell matrix array, affording plural FET integrated structure.

BRIEF DESCRIPTION OF THE DRAWINGS

Prior Art

FIGS. 1 through 11 show prior art.

FIG. 1 is a schematic cross-sectional view of a VMOS FET.

FIG. 2 is a schematic cross-sectional view of a DMOS FET.

FIG. 3 is a schematic cross-sectional view of a VMOS FET with a polysilicon gate.

FIG. 4 is a schematic cross-sectional view of a DMOS FET with a polysilicon gate (HEXFET).

FIG. 5 shows a top view of the structure of FIG. 4, illustrating the HEX outline.

FIG. 6 is a schematic cross-sectional view of a SIPMOS FET.

FIGS. 7 through 10 schematically illustrate the process steps yielding the structure of FIG. 6.

FIG. 11 is a schematic cross-sectional view of a lateral MOSFET.

Present Invention

FIG. 12 is a schematic sectional view illustrating FET structure in accordance with the invention.

FIGS. 13 through 18 show the preferred processing of the structure of FIG. 12.

Figure 19:
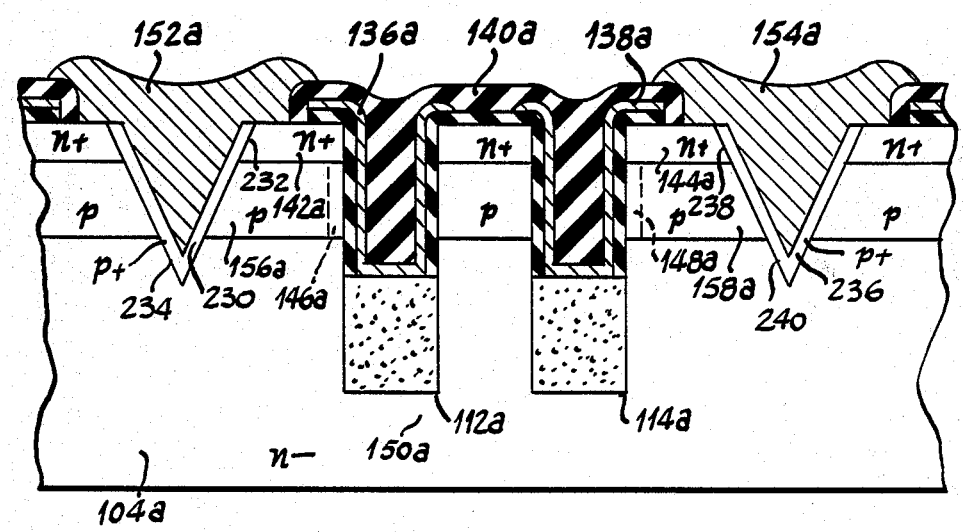

FIG. 19 is a schematic sectional view illustrating alternate FET structure.

Figure 20:
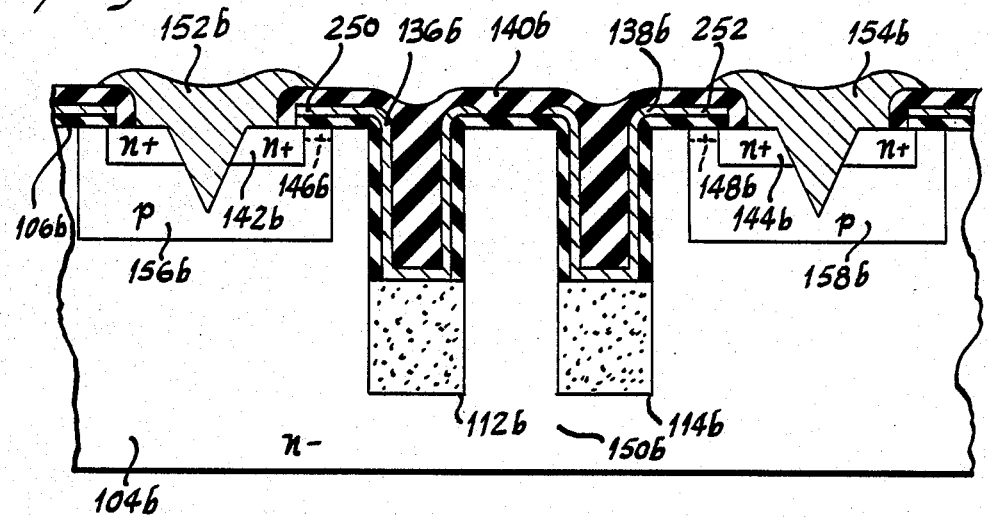

FIG. 20 is a schematic sectional view illustrating further alternate FET structure.

DESCRIPTION OF PRIOR ART AND POWER MOSFET TECHNOLOGY

MOSFETs can generally be classified into two groupings according to the principle orientation of current flow, namely vertical and lateral. For the vertical units, there are two predominant geometries, planar (HEXFET, TMOS, SIPMOS, etc.), and non-planar (VMOS, UMOS, etc.). The advantage that these devices enjoy over their lateral counterparts is that the drain contact is placed on the bottom of the chip. Thus, for a given chip area, higher current ratings (higher packing densities) are possible. As a consequence, almost all power MOSFET design has been concentrated on vertical configurations.

A cross-sectional view of a typical non-planar vertical device is illustrated in FIG. 1, showing a VMOS structure 2. The starting material is an n+ silicon wafer 4 with an n− epitaxial layer 6. Successive p and n+ diffusions are carried out, yielding layers 8 and 10. A groove is anisotropically etched to yield V-groove 12. An insulating oxide layer 14 is formed in the groove, followed by deposition of gate metalization 16. Source metalization 18 is deposited on the top major surface, and drain electrode metalization 20 is deposited on the bottom major surface.

FET channel 22 is through p region 8 along the edge of the V-groove. Upon application of a positive voltage on gate electrode 16 relative to source electrode 18, electrons in p region 8 are attracted into channel 22 to invert the conductivity type of the channel to n type. Electrons may then flow from source region 10 through channel 22 to drain region 4, and hence current may flow from drain electrode 20 through drain region 4 through channel 22 through source region 10 to source electrode 18.

One of the main advantages of the VMOS design is that the active channel length is extremely small and is determined by the difference in depth between the n+ source diffusion 10 and the p body diffusion 8. The technology in diffusion is sufficiently well advanced so that this dimension can be very tightly controlled. Thus the channel resistance can be closely held to a maximum specification.

One type of VMOS or UMOS (truncated VMOS) design is the notched MOSFET structure, for example "A Parametric Study of Power MOSFETs", C. Hu, IEEE Electron Device Conference, paper CH1461-3/79, 0000–0385. Notched grooves as narrow as 1 micron are provided by anisotropic etching, IEEE Transactions Electron Device, Volume ED-25, #10, October 1978, and "UMOS Transistors on (110) Silicon", Ammar and Rogers, Transactions IEEE, ED-27, May 1980, pages 907–914.

An alternative configuration is the DMOS (double diffused metal oxide semiconductor) FET 24, FIG. 2. N+ starting material 26 has an n− epilayer 28 into which p and n+ diffusions form regions 30 and 32. FET channel region 34 is formed at the top major surface over which insulating layer 36 is deposited, followed by gate metalization 38. Upon application of a positive voltage on gate electrode 38 relative to source electrode 40, electrons in p type region 30 are attracted towards the gate and congregate at the top major surface to thus invert the conductivity type along channel region 34 to n type. Current thus flows from drain electrode 42 through regions 26 and 28 and then through channel region 34 and then through source region 32 to source electrode 40, as shown by dashed line.

In the VMOS, UMOS and DMOS devices, the p body and the n+ source diffusions are carried out through the same opening in a silicon dioxide covering layer. As a consequence, the active channel region in DMOS FETs is also controlled by the difference in the diffusion depths. Lateral penetration is about 85% that of the vertical depth.

Stability of the operating specifications in MOS devices involves control of their threshold voltages, i.e. the value of the gate voltage required to produce the onset of drain to source conduction. This parameter is strongly influenced by the surface conditions of the silicon just over the channel region and the purity of the silicon dioxide, $SiO_2$ such as layers 14, FIG. 1, and 36, FIG. 2. During the thermal growth of the oxide, hydrogen chloride is introduced into the system to act as a gettering agent, thus providing fairly pure material.

A particularly troublesome element is sodium because any Na+ ions in the oxide tend to reduce the threshold of n channel devices, and an overabundance of them can prevent turn-off altogether. If aluminum gate metal is placed directly onto the gate oxide, these ions, if present in the aluminum, can drift into the silicon dioxide and degrade the device performance. This is true for VMOS, UMOS, and DMOS devices.

If, however, the transistors are fabricated with a phosphorus rich polycrystalline silicon (polysilicon or poly-si) gate, the technology for these materials allows much purer gates to be constructed with much more stable thresholds. Examples of VMOS and DMOS (HEXFET) devices utilizing this technology are shown in FIGS. 3 and 4. FIG. 5 shows a top view of the structure of FIG. 4, illustrating the HEX outline. Gate electrode connections are attached along the edge of the wafer. The VMOS structure is classified as a vertical non-planar unit. The HEXFET structure is a vertical planar unit.

Another vertical planar unit is the SIPMOS structure shown in FIG. 6. An n− epitaxial layer 44 is grown on an n+ substrate 46, FIG. 7. The thickness and resistivity of epilayer 44 is determined by the breakover voltage versus ON state resistance compromise. Using standard photolithography techniques, a p+ layer 48 (boron) is driven into the epilayer approximately 2 to 3 microns. The wafer is then stripped of old silicon dioxide and a new extremely clean 50 to 60 nanometer silicon dioxide layer is grown, usually in an environment of hydrochloric acid. Polycrystalline silicon is then deposited on top of the wafer using the LPCVD (low pressure chemical vapor deposition) method. An n+ diffusion into the entire polysilicon layer is then performed to provide for the gettering action of the phosphorous against sodium ions and provide a means to reduce the resistivity of the gate material, although it will still be a factor of 3,000 higher than aluminum. The entire surface of the polysilicon-phosphorous (Si/P) layer is bombarded by ion implantation in order to intentionally damage the top surface. Photoresist material is placed on the Si/P, developed and etched. Since the top etches faster than the bottom, due to the damage, the taper shown in FIG. 8 results. By using this tapered gate arrangement, the subsequent implants are more uniform up to the silicon gate oxide surface.

A light, carefully controlled, ion implanted p region 52, FIG. 9, is now added, which will be the channel region. After implantation, a drive-in diffusion moves this layer about one micron below the wafer surface. No oxide masking is needed because the Si/P gate serves that function as mentioned above. An n+ source region 54 is now ion implanted through the same opening in the Si/P gate grid structure. The impurity density is selected that the p+ region 48 is greater than n+ source region 54, and the depth of n+ source region 54 is typically 0.4 microns. A heavy low temperature oxide layer 56, FIG. 6, is applied, followed by a pre-ohmic and ohmic aluminum step yielding drain electrode 58 and source electrode 60.

As noted above, almost all power MOSFET design has been concentrated on vertical configurations. An example of the other general class of MOSFETs, the lateral type, is shown in FIG. 11.

Lateral MOSFET 62 has a substrate including an n− epitaxial layer 64 into which are diffused p region 66, n+ source region 68 and n+ drain region 70. Upon application of a positive voltage on gate electrode 72 relative to source electrode 74, electrons in p region 66 are attracted to the top surface of the substrate to invert the conductivity type along channel region 76 to n type, whereby electrons flow from source 68 through channel 76 through drift region 62 to drain 70, and current thus flows from drain electrode 78 through channel 76 to source electrode 74. The principal advantage of lateral device 62 is ease of implementation in integrated geometries where all leads are accessible.

As with the previously mentioned vertical MOSFETs, the lateral MOSFET 62 of FIG. 11 is unidirectional.

Device 62 is subject to the above noted tradeoff between lateral length of the drift region 80 (i.e. the distance between regions 76 and 70) versus the blocking voltage. Blocking voltage can be increased by making drift region 80 longer, but this in turn undesirably increases the ON state resistance.

It will be noted that each of the above references is to enhancement mode devices. Since the electron mobility is about 2.5 times greater than the hole mobility in silicon, the most common channel is n type. The ON state channel resistance is determined by the degree to which one can enhance the initial conductivity of the semiconductor. Thus larger gate voltages generally produce lower ON state resistances. If the devices were constructed as depletion mode units, the ON state resistance occurring at zero gate signal would be fixed by the conductivity of the starting material. Little if any reduction in ON state resistance could be effected by application of gate voltage. Since the starting resistivity must be high in order to sustain high blocking voltages in the OFF state, the ON state resistance of depletion mode devices currently being fabricated is considered too large to be a serious contender in power FET development. From this perspective, since all current JFETs are depletion mode devices, JFET configurations have not been seriously considered for power switching applications.

DETAILED DESCRIPTION OF THE INVENTION

Reviewing FIGS. 1 through 11, it is seen that in each case the transistor will not support a reverse drain to source voltage. Each device is unidirectional in that only one junction drop separates drain and source when (for the n channel devices shown) the drain is negative with respect to the source. In many applications, these devices can be effectively employed. But if AC line voltage is to be the drain-source driving function, then a bidirectional design becomes mandatory. Again, inspection of the device geometries in FIGS. 1 through 11 shows that the reason for the unidirectional design stems from the use of the device as a three terminal element, i.e. both the drain and the gate voltages are referenced to the common source point. It is necessary that the source electrode be in contact with the n+ source region and also with the p body region (to provide the gate return contact). Thus, the blocking action of the pn epijunction is negated.

Referring to FIG. 1, for example, if device 2 were supplied with a separate electrode for p region 8, and the source metalization 18 contacted only the n+ source region 10, a bidirectional FET would result. There would be considerable asymmetry due to unequal blocking capabilities of the n region 6 and p region 8. Likewise in FIG. 11, if a separate electrode is provided for p region 66 and if source metalization 74 contacted only source region 68, then a bidirectional FET would result, but there would be considerable asymmetry due to the unequal blocking capabilities of n region 64 and p region 66. Thus a new geometry and perhaps technology would be required.

Though not limited thereto, the present invention evolved from efforts to provide bidirectionality in a power FET without having to overcome these immediately above noted difficulties. The invention has broad application, however, to various lateral FETs where it is desired to increase voltage blocking capability without increasing lateral dimensions. The disclosed preferred embodiment provides in combination a simple yet effective MOSFET structure avoiding the noted difficulties while providing bidirectional current flow with high voltage blocking capability in minimum lateral dimensions.

FIG. 12 schematically shows lateral bidirectional power FET structure constructed in accordance with the invention. FET structure 102 includes a substrate 104 of one conductivity type having a top major surface 106. A first top layer 108 of opposite conductivity type is on the substrate, and a second top layer 110 is on the first top layer 108. As will be more fully described hereinafter, a plurality of notch pairs 112 and 114, 116 and 118, 120 and 122 and so, are formed in the substrate from top major surface 106 through n+ top layer 110 and through p top layer 108 into n− substrate 104.

The notches may be anisotropically etched, as known in the art: C. Hu, "A Parametric Study of Power MOS- FETs," IEEE Electron Device Conference, paper CH 1461-3/79, 0000-0385; IEEE Transactions Electron Devices, Volume ED-25, #10, October 1978; and Ammar and Rogers, "UMOS Transistors on Silicon", Transactions IEEE, ED-27, pages 907–914, May 1980. Alternatively, the notches may be formed by a porous silicon region in accordance with the known anodization technique of passing a fixed current through the localized region in the presence of hydrogen floride to create a structural change in the silicon which remains single crystalline with the substrate but becomes porous. In the latter technique, the substrate is then subjected to an oxidizing atmosphere such that the oxygen enters the pores in porous regions 124, 126 and so on, and rapidly oxidizes these region, whereby these regions become substantially non-conductive. During the oxidation, insulating oxide layers 128, 130, 132, 134 and so, are formed along the walls of the notches, after which gate electrodes 136, 138, and so on are deposited, for example by sputtering or the like, followed by a top insulating layer 140.

Notch pair 112 and 114 extends from top major surface 106 downwardly through top layer 110 and top layer 108 into substrate region 104. This notch pair separates the second top layer 110 into left and right source regions 142 and 144. Notch pair 112 and 114 separate the first top layer 108 into first and second p regions 156 and 158 having left and right channel regions 146 and 148. The substrate region 104 around the notches forms a drift region 150. Left main electrode metalization 152 extends into and through the first source region 142 and into the left p layer region 156 having first channel region 146. Right main electrode 154 extends into and through the second source region 144 and into the right region 158 of p layer 108 having the second channel 148. The grooves for these main electrodes may be provided by anisotropic etching.

Upon application of a positive voltage to left gate electrode 136 with respect to left main electrode 152, electrons in left p layer region 156 are attracted to channel region 146 to invert the conductivity type therein to n type and hence allow electron flow from n+ source region 142 through left channel 146 into drift region 150 in substrate 104. If right main electrode 154 is positive with respect to left main electrode 152, current may then flow from right electrode 154 and right p layer region 158 momentarily across a forward biased pn junction 160 into drift region 150, then through left channel 146 to left source region 142 and left main electrode 152. As soon as current starts to flow through the FET, the voltage across main electrodes 154 and 152 drops, which in turn reduces the potential in various regions of the FET, including portion 162 of the right p layer region 158 adjacent the right FET channel 148. Portion 162 thus becomes negative relative to right gate electrode 138 at a given gate potential, whereby positive right gate electrode 138 attracts electrons into right channel region 148 to invert the conductivity type thereof to n type, and hence render right channel 148 conductive. Forward biased pn junction 160 thus conducts only momentarily until the second channel 148 turns on.

The main current path through FET 102 is from right main electrode 154 through right source region 144, downwardly through vertical right channel region 148 along the right distal side of right notch 114, then further downwardly into drift region 150 along the right side of the right notch 114, then around the bottoms 164 and 166 of the notches, then upwardly along the left distal side of left notch 112 in drift region 150 of substrate 104, then upwardly through vertical left channel region 146 along the left side of left notch 112, then through left source region 142 to left main electrode 152.

The structure is bi-lateral, and thus current may also flow from main electrode 152 to main electrode 154 when gate 138 is positive with respect to main electrode 154. Electrons in right p layer region 158 are attracted into right channel region 148 by gate 138 to thus invert channel region 148 to n type and hence allow electron flow from n+ source region 144 through right channel 148 into drift region 150 in substrate 104. If left main electrode 152 is positive with respect to right main electrode 154, current then flows from left p layer region 156 momentarily across forward biased pn junction 168 until channel 146 turns on. The main current path is from left main electrode 152, through left source region 142, through left channel 146, through drift region 150, through right channel 148, through right source 144 to right main electrode 154. Main electrode 154 thus serves as an electron current source when a negative voltage is applied thereto relative to the voltage on main electrode 152, and serves as an anode when a positive voltage is applied thereto relative to the voltage on main electrode 152.

The application of electrical gate potential to first and second gate electrodes 136 and 138 enables them to produce electric fields of sufficient intensity to invert the conductivity type in respective first and second channel regions 146 and 148. Upon application of voltage of either polarity to the first and second main electrodes 152 and 154, electric current can flow in a respective corresponding direction between them, under control of the electrical gate potential of the gate electrodes 136 and 138. The current flow between laterally spaced apart regions 142 and 144 is controllable by controlling the electric fields in channel regions 146 and 148, which in turn are controllable by controlling the electric potential on the gate electrodes 136 and 138.

In the absence of gate potential on gate electrodes 136 and 138, channel regions 146 and 148 are p type, and the device is in a blocking OFF state. Current from main electrode 152 to main electrode 154 is blocked by junction 160. Current flow in the other direction from main electrode 154 to main electrode 152 is blocked by junction 168.

Bidirectional FET 102 may be used to control AC power. FIG. 12 schematically shows a load 170 and a source of AC power 172 connected across main electrodes 152 and 154. Gate electrode 136 is connected by a gate terminal 174 to a source of gate potential 176 through switch means 178. Gate electrode 138 is connected by a gate terminal 180 to a source of gate potential 182 through switch means 184. In the ON state of FET 102, switches 178 and 184 are in the upward position such that a given polarity gate potential is applied to gates 136 and 138, which potential is positive with respect to the most negative level of the AC source regardless of which half cycle. When main electrode 154 is positive with respect to main electrode 152, as driven by AC source 172, gate electrode 136 is positive with respect to p layer region 156 and main electrode 152. Hence, channel 146 is inverted to n type and conduction occurs, i.e., current flows from positive main electrode 154, through source region 144, through channel 148, through drift region 150 around the bottoms 164 and 166 of the notches, through channel 146, through source 142 to negative main electrode 152 and through load 170.

In the other half cycle of the AC source 172, main electrode 152 is positive with respect to main electrode 154, and gate electrode 138 is positive with respect to p layer region 158 and negative main electrode 154. Conduction is thus enabled through channel 148, and current flows from positive main electrode 152 through source 142, through channel 146, through drift region 150 around the bottoms of the notches in substrate 104, through channel 148, to source 144 and main electrode 154.

In preferred form, the structure of FIG. 12 enables non-floating gate implementations in the OFF state while still affording high OFF state voltage blocking capability. In the OFF state, switches 178 and 184 are in the downward position such that left gate electrode 136 is connected to the same potential level as left main electrode 152 and right gate electrode 138 is connected to the same potential level as right main electrode 154.

During the first half cycle in the OFF state, the voltage on right main electrode 154 rises positively relative to left main electrode 152. Since right main electrode 154 extends down into p layer region 158, the potential in the latter region likewise rises positively. Furthermore, since there is only a single junction drop across forward biased junction 160, the potential level in substrate 104 beneath junction 160 likewise rises positively. The left gate electrode 136 is relatively negative since it is connected through switch 178 to the negative main electrode 152, and hence the potential in area 186 of the substrate along the upper left side of left notch 112 is at a low potential level close to that of gate electrode 136. The potential level in substrate 104 increases as one proceeds downwardly along the left side of left notch 112 as shown at area 188. The potential level in area 190 of the substrate along the right side of right notch 114 is higher than the potential along the left side of left notch 112, and hence an electric field gradient exists between these distal edges of the right and left notches 114 and 112. The highest potential level in substrate 104 is in area 192 at the right edge of right notch 114 just below junction 160 and right channel region 148. The strongest electric field gradient thus exists between positive right edge area 192 and negative left gate electrode 136. This electric field gradient causes attraction of holes into area 192 and depletion of majority carrier electrons out of area 192 of substrate 104.

If the electric field gradient induced depletion in area 192 becomes great enough, the surface concentration of minority carrier holes along the right edge of right notch 114 becomes high enough to form a conduction channel. This formation of a conductive p channel through substrate region 104 quickly spreads around the notches due to the lower gradients, and hence a conductive p channel is formed between p layer regions 158 and 156, whereby the device can no longer block current. The limits the OFF state voltage blocking capability of the device.

The structure in FIG. 12 enhances OFF state voltage blocking capability in a number of ways. Right gate electrode 138 is insulated between left gate electrode 136 and right notch edge drift region portion 192 to shield the latter from electric field gradients from the left gate electrode 136, and prevent depletion and unwanted inducement of conduction channels in drift region 150 during the OFF state. Right gate electrode 138 is connected through switch 184 to the same potential level as right main electrode 154. Thus, as the potential of main electrode 154 rises positively, so does the potential of right gate electrode 138. The potential level of right notch edge drift region portion 192 is thus substantially the same as the potential level of right gate electrode 138. Since right gate electrode 138 is interposed between left gate electrode 136 and right notch edge drift region portion 192, the latter is shielded from the electric field gradient from negative left gate electrode 136. This enables higher OFF state voltage blocking capability.

In preferred form, gate electrodes 136 and 138 do not extend too far down into drift region 150 within notches 112 and 114. This further prevents unwanted inducement of conduction channels in the OFF state, which in turn further affords higher OFF state voltage blocking capability. The spacing of gate electrodes 136 and 138 from the edges of the notches, particularly the substantially increased spacing above the bottoms 166 and 164 of the notches, further diminishes the attractive force on carrier holes in substrate 104 towards the edges of notches 112 and 114. It is preferred that the notches and insulative portions 124 and 126 extend downwardly into the substrate drift region 150 a substantial distance below gate electrodes 136 and 138, and that the gate electrodes 136 and 138 extend down to about the depth of junctions 168 and 160.

Higher OFF state voltage blocking capability is further afforded by the increased drift region current path length. The current path extends downwardly and around the bottoms of notches 166 and 164. This increases the drift region current path length and further affords higher OFF state voltage blocking capability without increasing the lateral dimension along top major surface 106, whereby to afford high density, high voltage bidirectional FET structure.

As seen in FIG. 12, a plurality of FETs are afforded in the integrated structure. Main electrode metalizations 194, 196 and so on, are provided comparably to that described, and connected in series in the AC load line, or in parallel as shown in FIG. 12. Left gate electrodes 136, 198, 202 and so on, are connected in parallel to gate terminal 174. Right gate electrodes 138, 204, 206 and so on, are connected in parallel to gate terminal 180. Main electrode 154 provides the source electrode for the FET to the left around notch pair 112 and 114, and also provides the source electrode for the FET to the right around notch pair 116 and 118. Main electrode 194 provides the drain electrode for the FET around notch pair 116 and 118, and also provides the drain electrode for the FET around notch pair 120 and 122. In the other half cycle of AC source 172, the roles of electrodes 154 and 194 are reversed, i.e. electrode 154 is the drain for its left and right FETs around respective notch pairs 112 and 114, and 116 and 118; and electrode 194 is the source for its left and right FETs around respective notch pairs 116 and 118, and 120 and 122. Alternate electrodes 152, 194 and so on, are thus connected to one side of the AC source, and the other alternate electrodes 154, 196 and so on, are connected to the other side of the AC source.

There is thus shown a lateral bidirectional dual notch power FET, including: a first source region 142 of one conductivity type; a first region 156 of opposite conductivity type forming a junction 143 with first source region 142 and including a first channel region 146; a drift region 150 forming another junction 168 with the first region 156 of opposite conductivity type having the first channel region 146; a second region 158 of the opposite conductivity type forming a junction 160 with drift region 150 and including a second channel region 148; a second source region 144 of the one conductivity type forming a junction 145 with the second region 158 of opposite conductivity type having the second channel region 148; first and second spaced notches 112 and 114 extending between the first and second source regions 142 and 144 and the first and second channel regions 146 and 148, and extending into drift region 150 in substrate 104; first insulated gate means 136 in first notch 112 and including at least a portion proximate and insulated from first channel region 146 and adapted for application of electrical potential for producing electric fields of sufficient intensity to invert the conductivity type in first channel region 146; second insulated gate means 138 in second notch 114 and including at least a portion proximate to and insulated from second channel region 148 and adapted for application of electrical potential for producing electric fields of sufficient intensity to invert the conductivity type in the second channel region 148; first main electrode means 152 extending into and through first source region 142 and at least into the first region 156 of opposite conductivity type having the first channel region 146; second main electrode means 154 extending into and through second source region 144 and extending at least into the second region 158 of opposite conductivity type having the second channel region 148; whereby upon application of voltage of either polarity to said first and second main electrode means, current can flow in a respective corresponding direction between them, under control of the electrical potential of the gate means, the conductive current path through drift region 150 traversing along the distal sides of the notches and around the bottoms of the notches, i.e. traversing along the right edge of right notch 114 and along the left edge of left notch 112 and around the bottoms 166 and 164 of the notches.

Figure 13:
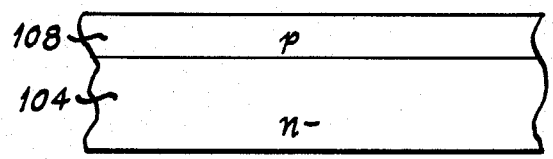
Figure 14:
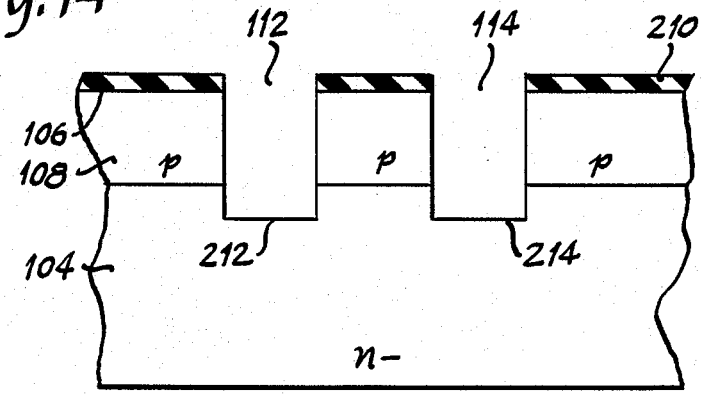
Figure 15:
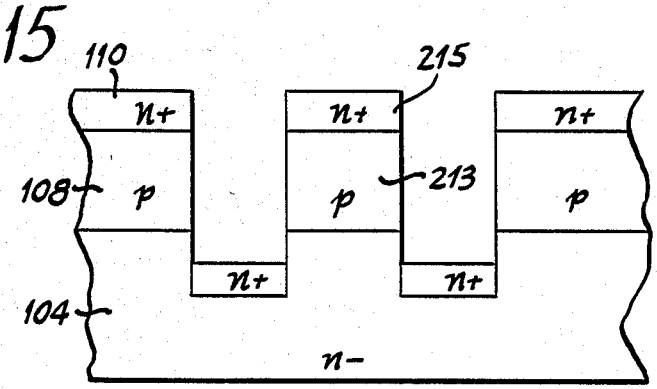

FIGS. 13 through 18 show the processing of the structure of FIG. 12, and like reference numerals are used where appropriate to facilitate clarity. Starting with a lightly doped n− substrate 104 in FIG. 13, for example having a donor density of about $5 \times 10^{14}$ donor atoms per cubic centimeter, p type epitaxial layer 108 is provided with boron at a density of about $1 \times 10^{18}$ donor atoms per cubic centimeter, and having a depth of about 3 microns. A silicon nitrite insulating layer 210, FIG. 14, is then deposited, followed by plasma etching to yield notch holes 112 and 114 down to levels 212 and 214 about 4 microns below top major surface 106. After removal of the silicon nitrite, the n+ layer 110, FIG. 15, is then applied by ion implantation of arsenic, antimony, or the like, normal, i.e. 90 degrees, to the substrate, followed by annealing to activate the implant and provide a depth of about 1 micron. P layer 108 has a region 213 between the notches, and n+ layer 110 has a region 215 between the notches.

Figure 16:
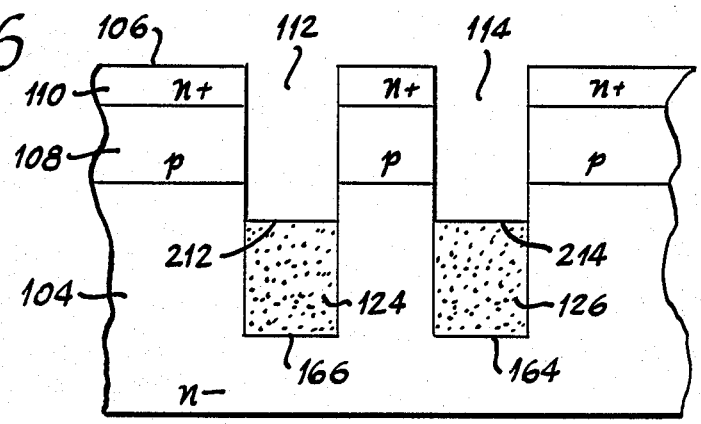

The porous silicon regions 124 and 126, FIG. 16, are then formed by anodization in the presence of hydrogen floride as above. Contacts are placed on the top and bottom surfaces, and because of the pn junctions, current will only pass through the notch holes 112 and 114 to thus provide selective anodization through vertical regions 124 and 126. A structural change is created in the silicon which remains single crystalline with substrate 104 but becomes porous. The depth of porous silicon regions 124 and 126 at the bottom notch edges 166 and 164 is about 15 microns below top major surface 106. The substrate is then subjected to an oxidizing atmosphere such that the oxygen enters the pores in porous regions 124 and 126 and rapidly oxidizes these regions, whereby regions 124 and 126 are still single crystalline with substrate 104 but substantially non-conductive. The width of each notch is about 5 microns, and the spacing between the notches is also about 5 microns.

Figure 17:
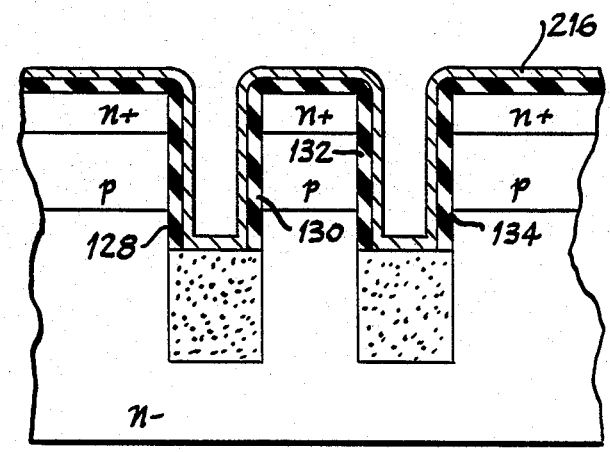
Figure 18:
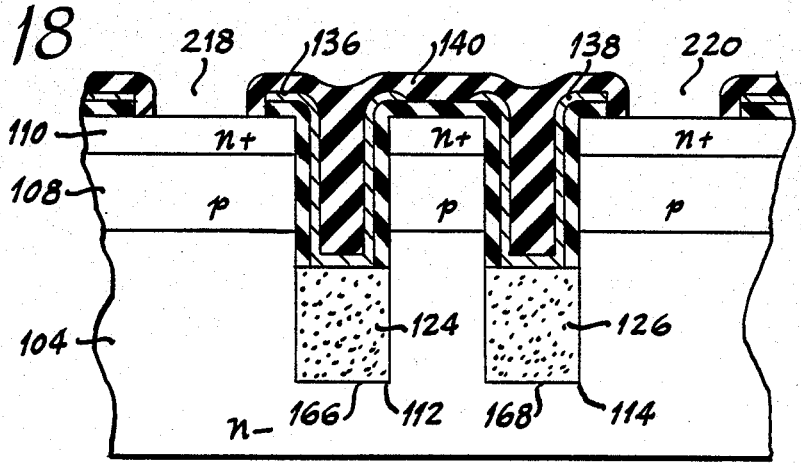

During the oxidation, insulation layers are formed on the substrate, including insulation layers 128, 130, 132, 134 and so on, along the vertical walls of the notches, FIG. 17. Gate metalization 216 is then applied, for example by sputtering of titanium disilicide, tantalum disilicide, or tungsten disilicide. The substrate is then masked and etched, followed by low temperature silicon dioxide chemical vapor deposition, FIG. 18, providing gate electrodes 136 and 138, insulating layer 140, and open areas 218 and 220. These open areas are then anisotropically etched through n+ layer 110 and at least into p layer 108, followed by aluminum metalization sputtering or deposition, resulting in main electrodes 152, 154 and so on, FIG. 12.

FIG. 19 shows alternative structure to that of FIG. 12, and like reference numerals are used with the postscript "a" where appropriate to facilitate clarity. First main electrode means 152a extends into and through the first source region 142a, and into and through the first region 156a of opposite conductivity type having the first channel region 146a, and into drift region 150a of substrate 104a. First main electrode means 152a includes a layer of semiconductor material 230 of the opposite conductivity type extending contiguously along the first main electrode means and forming a junction 232 with first source region 142a and forming a junction 234 with drift region 150a.

Second main electrode means 154a likewise extends into and through second source region 144a, and into and through the second region 158a of opposite conductivity type having the second channel region 148a, and into drift region 150a of substrate 104a. Second main electrode means 154a includes a layer 236 of semiconductor material of the opposite conductivity type extending contiguously along the second main electrode means and forming a junction 238 with second source region 144a and forming a junction 240 with drift region 150a. Layers 230 and 236 are formed after the anisotropic etch in open areas 218 and 220, FIG. 18. Operation of the structure of FIG. 19 is comparable to that of FIG. 12. OFF state voltage blocking is provided by junctions 234 and 240, comparably to junctions 168 and 160 of FIG. 12.

FIG. 20 shows further alternative structure to that of FIG. 12, and like reference characters are used with the postscript "b" where appropriate to facilitate clarity. The FET channels are provided by lateral channels 146b and 148b in p regions 156b and 158b from respective source regions 142b and 144b to the substrate drift region 150b of substrate 104b. Insulated gate means 136b is disposed in the left notch 112b and includes a portion 250 proximate to and insulated from lateral left channel 146b along top major surface 106b. The second right insulated gate means 138b is disposed in the second notch 114b and includes a portion 252 extending laterally and proximate to and insulated from lateral channel 148b along top major surface 106b. Main electrodes 152b and 154b may also extend through p regions 156b and 158b into drift region 150b as in FIG. 19.

It is recognized that various modifications are possible within the scope of the appended claims.

We claim:

1. A bidirectional FET, comprising in a semiconductor substrate:
   a first source region of one conductivity type semiconductor material;
   a first region of opposite conductivity type semiconductor material including a first channel region portion and forming a junction with said first source region;
   a single drift region of one conductivity type semiconductor material forming another junction with said first region of opposite conductivity type;
   a second region of opposite conductivity type semiconductor material including a second channel region portion and forming a junction with said drift region;
   a second source region of said one conductivity type semiconductor material forming a junction with said second region of opposite conductivity type;
   first and second spaced notches extending between said first and second source regions and said first and second channel regions, and extending into said drift region;
   first insulated gate means in said first notch and including a portion proximate said first channel region and adapted for application of an electrical potential for producing electric fields of sufficient intensity to invert the conductivity type in said first channel region;
   second insulated gate means in said second notch and including a portion proximate said second channel region and adapted for application of an electrical potential for producing electric fields of sufficient intensity to invert the conductivity type in said second channel region;
   first main electrode means extending into and through said first source region and into at least said first region of opposite conductivity type;
   second main electrode means extending into and through said second source region and into at least said second region of opposite conductivity type;
   said single drift region forming first and second PN junctions with respective said first and second channel regions, said first and second source regions forming third and fourth PN junctions with respective said first and second channel regions;
   a source of alternating voltage impressed across said first and second main electrode means such that during the first half cycle of said alternating voltage said first PN junction is a forward biased junction and said second PN junction is a reverse biased junction, and such that during the second half cycle of said alternating voltage said second PN junction is a forward biased junction and said first PN junction is a reverse biased junction;
   a first gating voltage source connected to said first gate means in said second half cycle of said alternating voltage to create a first inversion channel region between said single drift region and said first source region to short the otherwise blocking reverse biased said first PN junction during said second half cycle of said alternating voltage such that current flows through said FET from said second main electrode means to said first main electrode means during said second half cycle of said alternating voltage;
   a second gating voltage source connected to said second gate means in said first half cycle of said alternating voltage to create a second inversion channel region between said single drift region and said second source region to short the otherwise blocking reverse biased said second PN junction during said first half cycle of said alternating voltage such that current flows through said FET from said first main electrode means to said second main electrode means during said first half cycle of said alternating voltage;
   said FET having an OFF state in the absence of said gating electrical potential from said first and second gating voltage sources, said single drift region supporting OFF state blocking voltage in both directions, and wherein said first and second gate means are at non-common potentials in said OFF state.

2. The invention according to claim 1 wherein:
   said first main electrode means extends through said first region of opposite conductivity type and into said drift region and further including a layer of said opposite conductivity type semiconductor material extending contiguously along said first main electrode means forming a junction with said first source region and forming a junction with said drift region; and
   said second main electrode means extends through said second region of opposite conductivity type and into said drift region, and further comprising a layer of semiconductor material of said opposite conductivity type extending contiguously along said second main electrode means forming a junction with said second source region and forming a junction with said drift region.

3. The invention according to claim 1 wherein said channel regions are laterally spaced by said notches, and said notches extend vertically downwardly from a top major surface of said FET, said drift region being below said channel regions and around the bottoms of said notches, two junctions being formed on opposite distal sides of said notches, one distal side having said junction between said first source region and said first channel region and said junction between said first channel region and said drift region, the other distal side having said junction between said second source region and said second channel region and said junction between said second channel region and said drift region.

4. The invention according to claim 3 wherein said source regions are laterally spaced along said top major surface by said notches therebetween, said main electrode means extending downwardly through respective said source regions.

5. The invention according to claim 4 wherein said channel regions extend generally vertically along respective said distal sides of said notches, said source regions being above respective said channel regions.

6. A bidirectional FET, comprising:
   a first source region of one conductivity type semiconductor material;
   a first region of opposite conductivity type semiconductor material including a first channel region portion and forming a junction with said first source region;
   a single drift region of one conductivity type semiconductor material forming another junction with said first region of opposite conductivity type;

a second region of opposite conductivity type semiconductor material including a second channel region portion and forming a junction with said drift region;

a second source region of said one conductivity type semiconductor material forming a junction with said second region of opposite conductivity type;

first and second spaced notches extending between said first and second source regions and said first and second channel regions, and extending into said drift region;

first insulated gate means in said first notch and including a portion proximate said first channel region and adapted for application of an electrical potential for producing electric fields of sufficient intensity to invert the conductivity type in said first channel region;

second insulated gate means in said second notch and including a portion proximate said second channel region and adapted for application of an electrical potential for producing electric fields of sufficient intensity to invert the conductivity type in said second channel region;

first main electrode means extending into and through said first source region and into at least said first region of opposite conductivity type;

second main electrode means extending into and through said second source region and into at least said second region of opposite conductivity type;

whereby upon application of voltage of either polarity to said first and second main electrode means, electric current can flow in a respective corresponding direction between them, under control of said electrical potential of said gate means, the conductive current path through said drift region traversing along the distal sides of said notches and around the ends of said notches, said single drift region around said notches supporting OFF state blocking voltage in both directions;

wherein said channel regions are laterally spaced by said notches, and said notches extend vertically downwardly from a top major surface of said FET, said drift region being below said channel regions and around the bottoms of said notches, two junctions being formed on opposite distal sides of said notches, one distal side having said junction between said first source region and said first channel region and said junction between said first channel region and said drift region, the other distal side having said junction between said second source region and said second channel region and said junction between said second channel region and said drift region;

wherein said source regions are laterally spaced along said top major surface by said notches therebetween, said main electrode means extending downwardly through respective said source regions;

wherein said channel regions extend generally vertically along respective said distal sides of said notches, said source regions being above respective said channel regions;

wherein:
said first insulated gate means comprises insulation layer means extending along the inner surface of said first notch, and gate electrode means disposed in said notch along said insulation layer means such that said first gate electrode means extends in close proximity along and insulated from said vertical first channel region; and said second insulated gate means comprises insulation layer means extending along the inner surface of said second notch and second gate electrode means disposed in said notch along said insulation layer means such that said second gate electrode means extends in close proximity along and insulated from said vertical second channel region;

wherein said FET has an OFF state in the absence of said electric gate potential, with the junction between said drift region and said first region of opposite conductivity type blocking current flow toward said first main electrode means, and with the junction between said drift region and said second region of opposite conductivity type blocking current flow toward said second main electrode means;

wherein:
the conductive current path in one direction through said FET traverses from said second main electrode means through said second source region, downwardly through said second channel region, downwardly through said drift region along the outer edge of said second notch, then around the bottoms of said notches, then upwardly in said drift region along the outer edge of said first notch, then upwardly through said first channel region to said first source region and said first main electrode means, and the conductive current in the reverse direction traverses the same path; and in said OFF state of said FET, said second gate electrode means is insulated between said first gate electrode means and said second notch edge drift region portion to shield the latter from electric field gradients from said first gate electrode means and prevent depletion and unwanted inducement of conduction channels in said drift region during said OFF state, said first gate electrode means being insulated between said second gate electrode means and said first notch edge drift region portion to shield the latter from electric field gradients from said second gate electrode means and prevent depletion and unwanted inducement of conduction channels in said drift region during said OFF state, whereby to afford higher OFF state voltage blocking capability, the increased drift region current path length around the bottoms of said notches further affording higher OFF state voltage blocking capability without increasing the lateral dimension along said top major surface, whereby to afford high density, high voltage bidirectional FET structure;

wherein said first and second notches extend downwardly into said drift region a substantial distance below said first and second gate electrode means to substantially diminish attraction of carriers by said gate electrode means from said drift region toward the edges of said notches, to further prevent unwanted inducement of conduction channels in said OFF state and further afford higher OFF state voltage blocking capability.

7. The invention according to claim 6 wherein said first and second notches extend downwardly into said drift region to a depth substantially below said first and second channel regions, and said first and second gate electrode means extend downwardly to about the depth of said junctions between said channel regions and said drift region.

8. A bidirectional FET, comprising:
a first source region of one conductivity type semiconductor material;
a first region of opposite conductivity type semiconductor material including a first channel region portion and forming a junction with said first source region;
a single drift region of one conductivity type semiconductor material forming another junction with said first region of opposite conductivity type;
a second region of opposite conductivity type semiconductor material including a second channel region portion and forming a junction with said drift region;
a second source region of said one conductivity type semiconductor material forming a junction with said second region of opposite conductivity type;
first and second spaced notches extending between said first and second source regions and said first and second channel regions, and extending into said drift region;
first insulated gate means in said first notch and including a portion proximate said first channel region and adapted for application of an electrical potential for producing electric fields of sufficient intensity to invert the conductivity type in said first channel region;
second insulated gate means in said second notch and including a portion proximate said second channel region and adapted for application of an electrical potential for producing electric fields of sufficient intensity to invert the conductivity type in said second channel region;
first main electrode means extending into and through said first source region and into at least said first region of opposite conductivity type;
second main electrode means extending into and through said second source region and into at least said second region of opposite conductivity type;
whereby upon application of voltage of either polarity to said first and second main electrode means, electric current can flow in a respective corresponding direction between them, under control of said electrical potential of said gate means, the conductive current path through said drift region traversing along the distal sides of said notches and around the ends of said notches, said single drift region around said notches supporting OFF state blocking voltage in both directions;
wherein:
said first main electrode means extends through said first region of opposite conductivity type and into said drift region and further including a layer of said opposite conductivity type semiconductor material extending contiguously along said first main electrode means forming a junction with said first source region and forming a junction with said drift region; and
said second main electrode means extends through said second region of opposite conductivity type and into said drift region, and further comprising a layer of semiconductor material of said opposite conductivity type extending contiguously along said second main electrode means forming a junction with said second source region and forming a junction with said drift region;
wherein said channel regions are spaced by said notches, and said notches extend downwardly from a top major surface of said FET, said drift region being below said channel regions and around the bottoms of said notches;
wherein said source regions are laterally spaced along said top major surface by said notches therebetween;
wherein said channel regions extend generally vertically along respective distal sides of said notches, said source regions being above respective said channel regions;
wherein:
said first gate means comprises insulation layer means extending along the inner surface of said first notch, and gate electrode means disposed in said first notch along said insulation layer means such that said first gate electrode means extends in close proximity along and insulated from said vertical first channel region;
said second insulated gate means comprises insulation layer means extending along the inner surface of said second notch, and second gate electrode means disposed in said second notch along said insulation layer means such that said second gate electrode means extends in close proximity along and insulated from said vertical second channel region;
wherein said FET has an OFF state in the absence of said electric gate potential, current flow toward said first main electrode means being blocked by the junction between said drift region and said first layer of opposite conductivity type extending contiguously along said first main electrode means and through said first source region, said first region of opposite conductivity type and into said drift region, and current flow toward said second main electrode means being blocked by the junction between said drift region and said second layer of opposite conductivity type extending contiguously along said second main electrode means through said second source region, said second region of opposite conductivity type and into said drift region;
wherein:
the conductive current path in one direction through said FET traverses from said second main electrode means through said second source region, downwardly through said second channel region, downwardly through said drift region along the outer distal edge of said second notch, then around the bottoms of said notches, then upwardly through said drift region along the outer distal edge of said first notch, then upwardly through said first channel region to said first source region and said first main electrode means, the conductive current in the reverse direction traversing the same path;
in said OFF state of said FET, said second gate electrode means being insulated between said first gate electrode means and said second notch edge drift region portion to shield the latter from electric field gradients from said first gate electrode means and prevent depletion and unwanted inducement of conduction channels in said drift region during said OFF state, said first gate electrode means being insulated between said second gate electrode means and said first notch edge drift region portion to shield the latter from electric field gradients from said second gate electrode means to prevent depletion and unwanted inducement of conduction channels in said drift region, to afford higher OFF state voltage blocking capability, the increased drift region current path length along and around said notches further affording higher OFF state voltage blocking capability without increasing the lateral dimension along said top major surface, whereby to afford high density, high voltage bidirectional FET structure; wherein said first and second notches extend downwardly into said drift region a substantial distance below said first and second gate electrode means to further substantially diminish attraction of carriers by said gate electrode means from said drift region toward the edges of said notches, to further prevent unwanted inducement of conduction channels in said OFF state and further afford higher OFF state voltage blocking capability.

9. The invention according to claim 8 wherein said first and second notches extend downwardly into said drift region to a depth substantially below said first and second channel regions, and said first and second gate electrode means means extend downwardly to about the depth of the junctions between said channel regions and said drift region.

10. The invention according to claim 1 wherein said channel regions extend generally horizontally along said top major surface between a respective said source region and said drift region, said portions of said insulated gate means extending horizontally along said top major surface above respective said channel regions.

11. The invention according to claim 10 wherein said channel regions are laterally spaced by said notches, and said notches extend downwardly from a top major surface of said FET.

12. The invention according to claim 11 wherein said source regions are laterally spaced along said top major surface by said notches therebetween, said main electrode means extending downwardly through respective said source regions.

13. A bidirectional FET, comprising:
a first source region of one conductivity type semiconductor material;
a first region of opposite conductivity type semiconductor material including a first channel region portion and forming a junction with said first source region;
a single drift region of one conductivity type semiconductor material forming another junction with said first region of opposite conductivity type;
a second region of opposite conductivity type semiconductor material including a second channel region portion and forming a junction with said drift region;
a second source region of said one conductivity type semiconductor material forming a junction with said second region of opposite conductivity type;
first and second spaced notches extending between said first and second source regions and said first and second channel regions, and extending into said drift region;
first insulated gate means in said first notch and including a portion proximate said first channel region and adapted for application of an electrical potential for producing electric fields of sufficient intensity to invert the conductivity type in said first channel region;
second insulated gate means in said second notch and including a portion proximate said second channel region and adapted for application of an electrical potential for producing electric fields of sufficient intensity to invert the conductivity type in said second channel region;
first main electrode means extending into and through said first source region and into at least said first region of opposite conductivity type;
second main electrode means extending into and through said second source region and into at least said second region of opposite conductivity type;
whereby upon application of voltage of either polarity to said first and second main electrode means, electric current can flow in a respective corresponding direction between them, under control of said electrical potential of said gate means, the conductive current path through said drift region traversing along the distal sides of said notches and around the ends of said notches, said single drift region around said notches supporting OFF state blocking voltage in both directions;
wherein said channel regions extend generally horizontally along said top major surface between a respective said source region and said drift region, said portions of said insulated gate means extending horizontally along said top major surface above respective said channel regions;
wherein said channel regions are laterally spaced by said notches, and said notches extend downwardly from a top major surface of said FET;
wherein said source regions are laterally spaced along said top major surface by said notches therebetween, said main electrode means extending downwardly through respective said source regions;
wherein:
the conductive current path in one direction through said FET traverses from said second main electrode means through said second source region, horizontally through said second channel region, downwardly through said drift region along the outer edge of said second notch, then around the bottoms of said notches, then upwardly in said drift region along the outer edge of said first notch, then horizontally through said first channel region to said first source region and said first main electrode means, and the conductive current in the reverse direction traverses the same path, said FET having an OFF state in the absence of said electric gate potential to block current flow in both directions;
in said OFF state of said FET, said second gate electrode means is insulated between said first gate electrode means and said second notch edge drift region portion to shield the latter from electric field gradients from said first gate electrode means and prevent depletion and unwanted inducement of conduction channels in said drift region during said OFF state, said first gate electrode means is insulated between said second gate electrode means and said first notch edge drift region portion to shield the latter from electric field gradients from said second gate electrode means and prevent depletion and unwanted inducement of conduction channels in said drift region during said OFF state, whereby to afford higher OFF state voltage blocking capability, the increased drift region current path length around the bottoms of said notches further affording higher OFF state voltage blocking capability without increasing the lateral dimension along said top major surface, whereby to afford high density, high voltage bidirectional FET structure;

wherein said first and second notches extend downwardly into said drift region a substantial distance below said first and second gate electrode means to substantially diminish attraction of carriers by said gate electrode means from said drift region toward the edges of said notches, to further prevent unwanted inducement of conduction channels in said OFF state and further afford higher OFF state voltage blocking capability.

14. The invention according to claim 13 wherein said first and second notches extend downwardly into said drift region to a depth substantially below said first and second regions of opposite conductivity type.

15. A bidirectional lateral power FET, comprising:
a substrate of semiconductor material of one conductivity type having at top major surface;
first and second regions of the other conductivity type laterally spaced in said substrate and including respective first and second channel regions;
first and second source regions of said one conductivity type laterally spaced along said top major surface and each forming a junction with a respective one of said first and second regions of other conductivity type having said channel regions;
first and second spaced notches in said substrate extending downwardly from said top major surface between said source regions and said channel regions into a drift region in said substrate, such that the conductive current path is directed from said first source region through said first channel region, then generally vertically downwardly through said drift region along the distal side of said first notch, then around the bottoms of said notches, then generally vertically upwardly in said drift region along the distal side of said second notch, then through said second channel region to said second source region, with the same path conducting current in the reverse direction from said second source region to said first source region;
first main electrode means extending into and through said first source region and into at least said first region of other conductivity type;
second main electrode means extending into and through said second source region and into at least said second region of other conductivity type;
first insulated gate electrode means in said first notch and including a portion proximate said first channel region for attracting given polarity carriers to invert said first channel region to said one conductivity type in response to given gate potential; and
second insulated gate electrode means in said second notch and including a portion proximate said second channel region for attracting given polarity carriers to invert said second channel region to said one conductivity type in response to given gate potential such that current may flow in either direction between said main electrode means;

wherein said notches extend downwardly into said drift region a substantial distance below said gate electrode means to further substantially diminish attraction of carriers by said gate electrode means from said drift region toward the edges of said notches, to further prevent unwanted inducement of conduction channels during said OFF state of said FET structure and afford higher OFF state voltage blocking capability, and wherein said channel regions extend vertically along notch edges, said notches extend downwardly into said drift region to a depth substantially below said channel regions, and said gate electrode means extend downwardly to about the depth of said channel regions, and wherein the portions of said notches below said gate electrode means comprise anodized single crystalline porous silicon oxidized to a substantially insulative condition.

16. Bidirectional laterally integrated power switching plural FET structure comprising:
a semiconductor body having a top major surface and including a lateral substrate layer of one conductivity type at a predetermined depth below said top major surface;
a top layer of opposite conductivity type on said substrate layer;
a second top layer of said one conductivity type on said first top layer;
a plurality of pairs of notches, extending downwardly from said top major surface through said first and second top layers into said substrate layer, each notch pair separating said second top layer into right and left source regions laterally spaced along said top major surface by said notch pair therebetween, each notch pair also separating said first top layer into right and left channel regions laterally spaced by the respective said notch pair extending therebetween, each notch pair further providing a singular drift region of said one conductivity type through said substrate layer, which singular drift region extends generally vertically along the distal sides of the notch pair and around the bottom thereof to provide substantially increased drift region path length without increased lateral dimension, said singular drift region around said notches supporting OFF state blocking voltage in both directions;
a plurality of left main electrodes extending into and through respective said left source regions, and extending at least into respective said left channel regions;
a plurality of right main electrodes extending into and through respective said right source region, and extending at least into respective said right channel regions;
a plurality of left gate electrodes in respective left notches of said pairs and including portions proximate to and insulated from said left channel regions for attracting given polarity carriers to invert said left channel regions to said one conductivity type in response to given gate potential;
a plurality of right gate electrodes in respective right notches of said pairs and including portions proximate to and insulated from respective said right channel regions for attracting given polarity carriers to invert said right channel regions to said one conductivity type in response to given gate potential;

such that current may flow in either direction between said left main electrodes and said right main electrodes, the conductive current path for each FET being from said right source region through said right channel region, then downwardly through said drift region along said right side of said right notch, then around the bottoms of said notches in said drift region in said substrate layer, then upwardly along the left side of said left notch in said drift region, then through said left channel region to said left source region, with the same path conducting current in the reverse direction from said left source region to said right source region for each said FET.

17. A bidirectional lateral power FET, comprising:
a substrate of semiconductor material of one conductivity type having a top major surface;
first and second regions of the other conductivity type laterally spaced in said substrate and including respective first and second channel regions;
first and second source regions of said one conductivity type laterally spaced along said top major surface and each forming a junction with a respective one of said first and second regions of other conductivity type having said channel regions;
notch means in said substrate extending downwardly from said top major surface between said source regions and said channel regions into a single drift region in said substrate, such that the conductive current path is directed from said first source region through said first channel region, then generally vertically downwardly through said drift region along a first side of said notch means, then around the bottom of said notch means, then generally vertically upwardly in said drift region along the other side of said notch means, then through said second channel region to said second source region, with the same path conducting current in the reverse direction from said second source region to said first source region, said single drift region around said notch means supporting OFF state blocking voltage in both directions;
first main electrode means extending into and through said first source region and into at least said first region of said other conductivity type;
second main electrode means extending into and through said second source region and into at least said second region of said other conductivity type;
first insulated gate electrode means in said notch means proximate said first channel region for attracting given polarity carriers to invert said first channel region to said one conductivity type in response to given gate potential;
second insulated gate electrode means in said notch means and including a portion proximate said second channel region for attracting given polarity carriers to invert said second channel region to said one conductivity type in response to given gate potential such that current may flow in either direction between said main electrode means;
said notch means extending downwardly into said single drift region a substantial distance below said gate electrode means.

18. The invention according to claim 17 wherein said channel regions extend vertically along edges of said notch means, said gate electrode means extending vertically downwardly to about the depth of said channel regions, said notch means extending vertically downwardly into said drift region to a depth substantially below said channel regions.

19. The invention according to claim 18 wherein the portion of said notch means below said gate electrode means comprises anodized single crystalline porous silicon oxidized to a substantially insulative condition.

20. The invention according to claim 18 wherein:
said first main electrode means extends through said first region of other conductivity type and into said single drift region and further including a layer of said other conductivity type semiconductor material extending contiguously along said first main electrode means forming a junction with said first source region and forming a junction with said single drift region; and
said second main electrode means extends through said second region of other conductivity type and into said single drift region and further including a layer of said other conductivity type semiconductor material extending contiguously along said second main electrode means forming a junction with said second source region and forming a junction with said single drift region.

* * * * *